United States Patent [19]

Ting

[11] Patent Number: 5,534,789
[45] Date of Patent: Jul. 9, 1996

[54] MIXED MODE OUTPUT BUFFER CIRCUIT FOR CMOSIC

[75] Inventor: Tah-Kang J. Ting, Hsinchu, Taiwan

[73] Assignee: Etron Technology, Inc., Hsinchu, Taiwan

[21] Appl. No.: 512,237

[22] Filed: Aug. 7, 1995

[51] Int. Cl.$^6$ .................................................. H03K 17/16
[52] U.S. Cl. ........................... 326/21; 326/58; 326/83; 326/81
[58] Field of Search ........................... 326/58, 81, 83, 326/86, 21, 27

[56] References Cited

U.S. PATENT DOCUMENTS

| | | | |
|---|---|---|---|
| 4,963,766 | 10/1990 | Lundberg | 326/58 |
| 5,266,849 | 11/1993 | Kitahara et al. | 326/21 |
| 5,338,978 | 8/1994 | Larsen | 326/21 |
| 5,450,025 | 9/1995 | Shay | 326/81 |
| 5,467,031 | 11/1995 | Nguyen | 326/58 |
| 5,493,233 | 2/1996 | Shigehara | 326/27 |

Primary Examiner—Edward P. Westin
Assistant Examiner—Andrew Sanders
Attorney, Agent, or Firm—George O. Saile; Larry J. Prescott

[57] ABSTRACT

This invention provides circuits which provide stable internally derived voltages for mixed mode large scale integrated circuits having SRAM, DRAM, and the like. The circuits use a summation of threshold voltages of metal oxide semiconductor field effect transistors to clamp voltages and a level detection circuit to compensate for variation in the primary supply voltage. A load detection and feedback circuit using a parasitic bipolar transistor provides voltage stability over a wide range of loading conditions.

10 Claims, 5 Drawing Sheets

MIXED MODE OUTPUT BUFFER CIRCUIT FOR CMOSIC

BACKGROUND OF THE INVENTION

1. Field of the Invention

This invention relates to circuits which provide stable internally derived voltages for integrated circuits. The internally derived voltages are stable over a wide range of primary supply voltage and loading conditions.

2. Description of the Related Art

In integrated circuit applications having mixed modes such as SRAM circuits, DRAM circuits, TTL circuits and the like a number of supply voltages are needed within the integrated circuit element. This invention provides a stable internal voltage of 4.3 volts and a stable output voltage of 3.3 volts using a primary supply voltage of between about 4.0 volts and 6.0 volts. A load detection and feedback circuit provides stability of these voltages over a wide range of loading conditions. We do not know of other art providing these stable internally derived voltages.

SUMMARY OF THE INVENTION

In many cases of large scale integrated circuit design a number of supply voltage levels are required and some of them must be internally derived within the integrated circuit chip. The internally derived voltages must be at the proper level and must be stable over a wide range of loading conditions.

It is a principle object of this invention to provide an internal voltage clamping circuit which has an internal node with a stable voltage over a wide range of primary supply voltage.

It is another principle object of this invention to provide an output voltage clamping circuit which has an output node with a stable voltage over a wide range of primary supply voltage.

It is still another principle objective of this invention to provide a load detection and feedback circuit to provide a stable output voltage over a wide range of loading conditions.

It is still another principle objective of this invention to provide an output buffer circuit which combines the internal voltage clamping circuit, the output voltage clamping circuit, and the load detection and feedback circuit to provide a stable output voltage over a wide range of primary supply voltage and loading conditions.

These objectives are achieved by using the sum of threshold voltages of a number of metal oxide semiconductor field effect transistors connected in series to form a voltage clamp. A voltage detection circuit is used to adjust for variations in the primary voltage supply. A feedback circuit using an NPN bipolar transistor is used to provide a stable output voltage over a wide range of loading conditions.

DESCRIPTION OF THE PREFERRED EMBODIMENTS

Figure 1A:
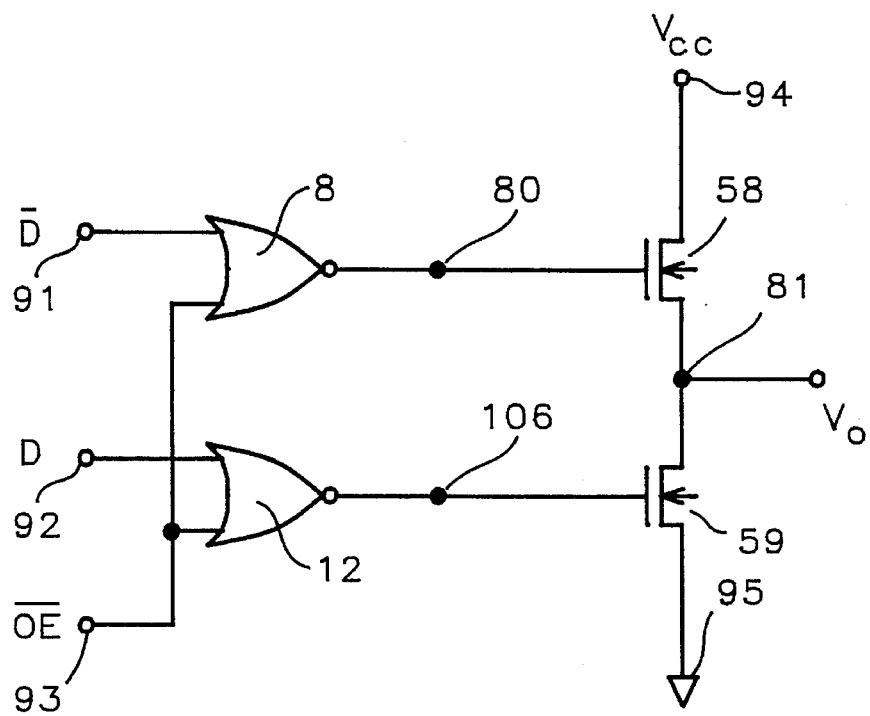
FIG. 1A is a diagram of a conventional buffer circuit comprising two input OR-INVERT gates driving an output circuit of two N channel metal oxide semiconductor field effect transistors.
Figure 1B:
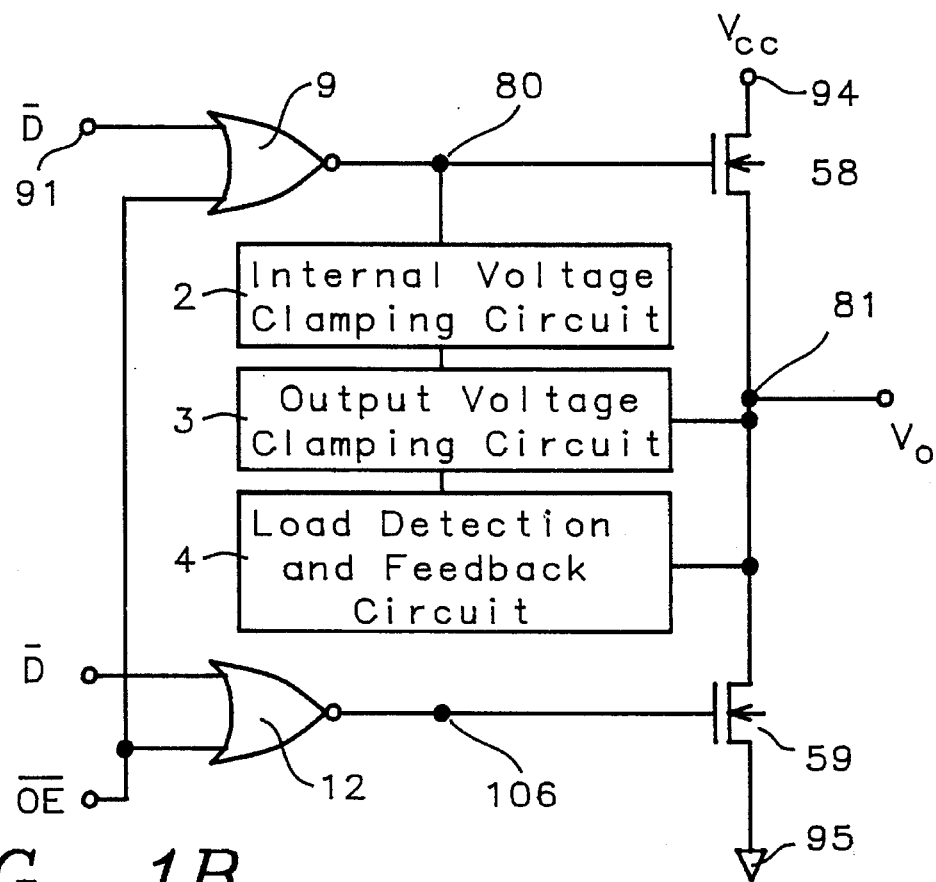
FIG. 1B is a block diagram of the mixed mode output buffer circuit of this invention comprising two input OR-INVERT gates, an internal voltage clamping circuit, an output voltage clamping circuit, and a load detection and feedback circuit.

Refer now to FIGS. 1A and 1B, there is shown a conventional output buffer circuit, FIG. 1A, and an embodiment of the mixed mode output buffer circuit of this invention, FIG. 1B. The conventional output buffer circuit, shown in FIG. 1A, has a first output N channel metal oxide semiconductor field effect transistor, NMOS-FET, 58 driven by a first OR-INVERT, or NOR, circuit, or gate, 8, and a second output NMOS-FET 59 driven by a second NOR circuit 12. The first NOR circuit 8 has a first input 91, second input 93, and an output. The second NOR circuit 12 has a first input 92, second input 93, and an output. The output of the first NOR circuit 8 is connected to a first node 80 and to the gate of the first output NMOS-FET 58. The output of the second NOR circuit 12 is connected to the gate of the second output NMOS-FET 59. The drain of the first output NMOS-FET 58 is connected to the $V_{cc}$ voltage supply of between about 4.0 volts and 6.0 volts. The source of the first output NMOS-FET 58 is connected to the drain of the second output NMOS-FET 59 and to the output voltage node 81. The source of the second output NMOS-FET 59 is connected to the ground node 95. In the conventional output buffer circuit fluctuations in the $V_{cc}$ supply voltage and variations in circuit loading can cause excessive variations in the voltage at the output voltage node 81.

An embodiment of the mixed mode output buffer circuit of this invention is shown in FIG. 1B. This circuit has a first output N channel metal oxide semiconductor field effect transistor, NMOS-FET, 58 driven by a modified NOR circuit 9, and a second output NMOS-FET 59 driven by a second NOR circuit 12. The modified NOR circuit 9 has a first input 91, second input 93, and an output. The second NOR circuit 12 has a first input 92, second input 93, and an output. The output of the modified NOR circuit 9 is connected to a first node 80 and to the gate of the first output NMOS-FET 58. The output of the second NOR circuit 12 is connected to the gate of the second output NMOS-FET 59. The drain of the first output NMOS-FET 58 is connected to the $V_{cc}$ voltage supply of between about 4.0 volts and 6.0 volts. The source of the first output NMOS-FET 58 is connected to the drain of the second output NMOS-FET 59 and to the output voltage node 81. The source of the second output NMOS-FET 59 is connected to the ground node 95. An internal voltage clamping circuit 2 is connected to the first node 80, an output voltage level clamping circuit 3 is connected to the internal voltage clamping circuit 2 and to the output voltage node 81, and a output load detection and feedback circuit 4 is connected to the output voltage level clamping circuit 3 and to the output voltage node 81.

The internal voltage clamping circuit 2 clamps the voltage at the first node 80 at about 4.3 volts when the voltage at the output node 81 is at the up level and the $V_{cc}$ supply voltage is between about 4.0 and 6.0 volts. The output level voltage clamping circuit 3 will clamp the voltage at the output voltage node 81 to about 3.3 volts when the output voltage is at the up level. The voltage at the output voltage node 81 is to be clamped at about 3.3 volts. If the output voltage node 81 is heavily loaded the load will tend to pull the voltage at the output voltage node 81 below 3.3 volts. The output load detection and feedback circuit 4 detects when loading at the output node 81 tends to pull the voltage at the output node 81 below about 3.3 volts and brings the voltage back up to about 3.3 volts.

Figure 2:
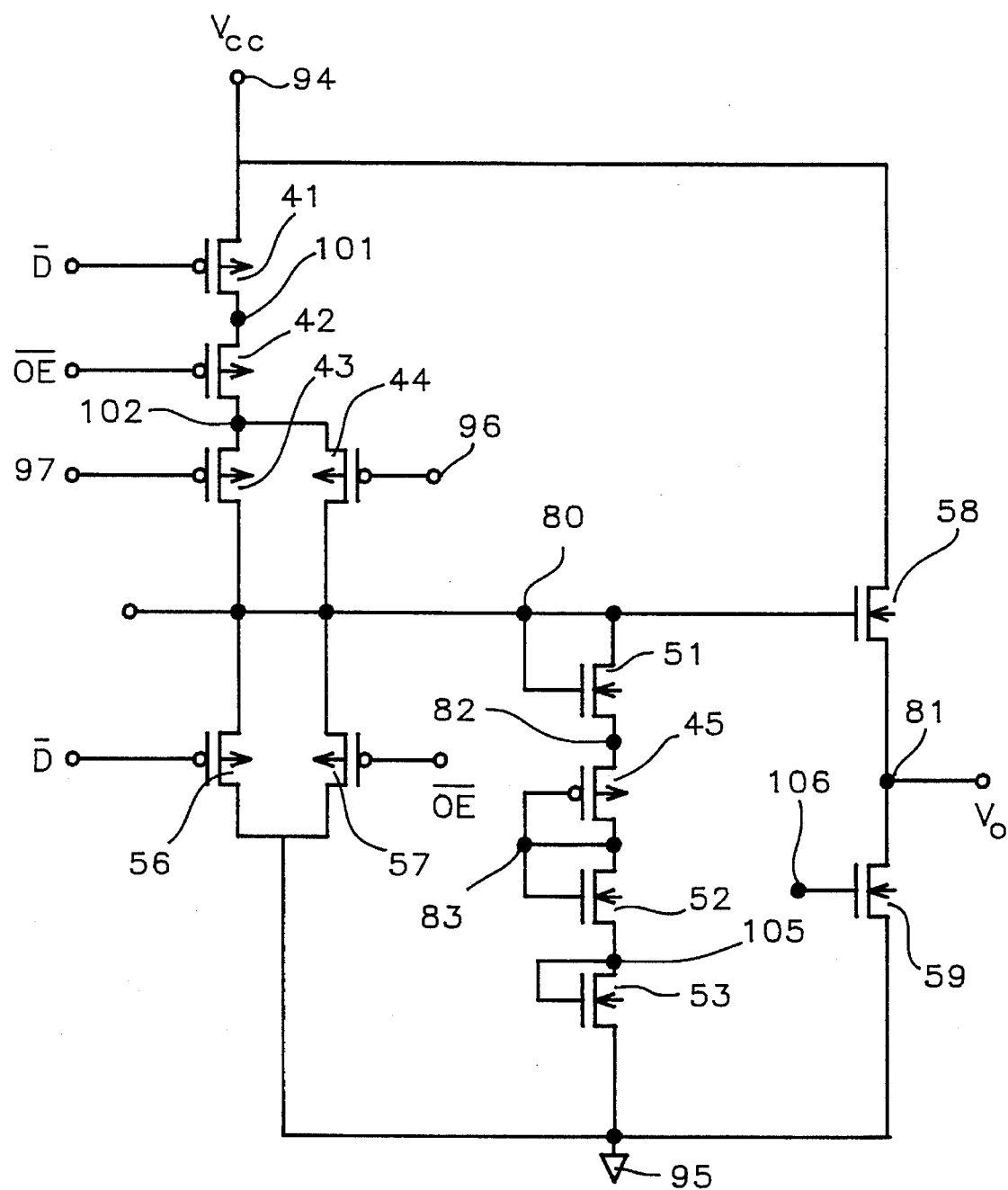
FIG. 2 is a schematic diagram of the internal voltage clamping circuit.

An embodiment of the modified NOR circuit and the internal voltage clamping circuit, is shown in FIG. 2. The internal voltage clamping circuit will clamp the voltage at the first node 80 to about 4.3 volts when the voltage at the output node 81 is at the up level. The modified NOR circuit comprises a first 41, second 42, third 43, and fourth 44 P channel metal oxide semiconductor field effect transistors, PMOS-FETs; and a sixth 56 and seventh 57 N channel metal oxide semiconductor field effect transistors, NMOS-FETs. The drain of the first PMOS-FET 41 is connected to the $V_{cc}$ supply voltage of between about 4.0 volts and 6.0 volts. The source of the first PMOS-FET 41 is connected to the drain of the second PMOS-FET 42. The source of the second PMOS-FET 42 is connected to the drains of the third PMOS-FET 43 and fourth PMOS-FET 44. The sources of the third PMOS-FET 43 and the fourth PMOS-FET 44 are connected to the first node 80, to the drains of the sixth NMOS-FET 56 and seventh NMOS-FET 57, and to the gate of the first output NMOS-FET 58. The inverse data signal is connected to the gates of the first PMOS-FET 41, the sixth NMOS-FET 56, and to one of the inputs of a first NOR circuit not shown in FIG. 2. The inverse clock signal is connected to the gates of the second PMOS-FET 42, the seventh NMOS-FET 57, and to another of the inputs of the first NOR circuit. The sources of the sixth NMOS-FET 56 and seventh NMOS-FET are connected to the ground node 95.

The internal voltage clamping circuit comprises a first NMOS-FET 51, a second NMOS-FET 52, a third NMOS-FET 53, and fifth PMOS-FET 45. The drain and gate of the first NMOS-FET 51 are connected to the first node 80. It is the voltage of this first node 80 which is to be clamped to a voltage of about 4.3 volts when the voltage of the output node 81 is at the up level. The source of the first NMOS-FET 51 is connected to the drain of the fifth PMOS-FET 45. The gate and source of the fifth PMOS-FET 45 and the gate and drain of the second NMOS-FET 52 are all connected together. The source of the second NMOS-FET 52 is connected to the gate and drain of the third NMOS-FET 53. The source of the third NMOS-FET 53 is connected to ground. The voltage between the first node 80 and ground 95 is limited to the sum of the threshold voltages of the first NMOS-FET 51, the fifth PMOS-FET 45, the second NMOS-FET 52, and the third NMOS-FET 53 since these FETs are connected in diode mode between the first node 80 and ground 95. The voltage at the first node 80 will be clamped to about 4.3 volts and will be independent of fluctuations in the Vcc voltage level. The gate of the first output NMOS-FET 58 is connected to the first node 80. The source of the first output NMOS-FET 58 is connected to the drain of the second output NMOS-FET 59 and to the output voltage node 81.

Figure 3:
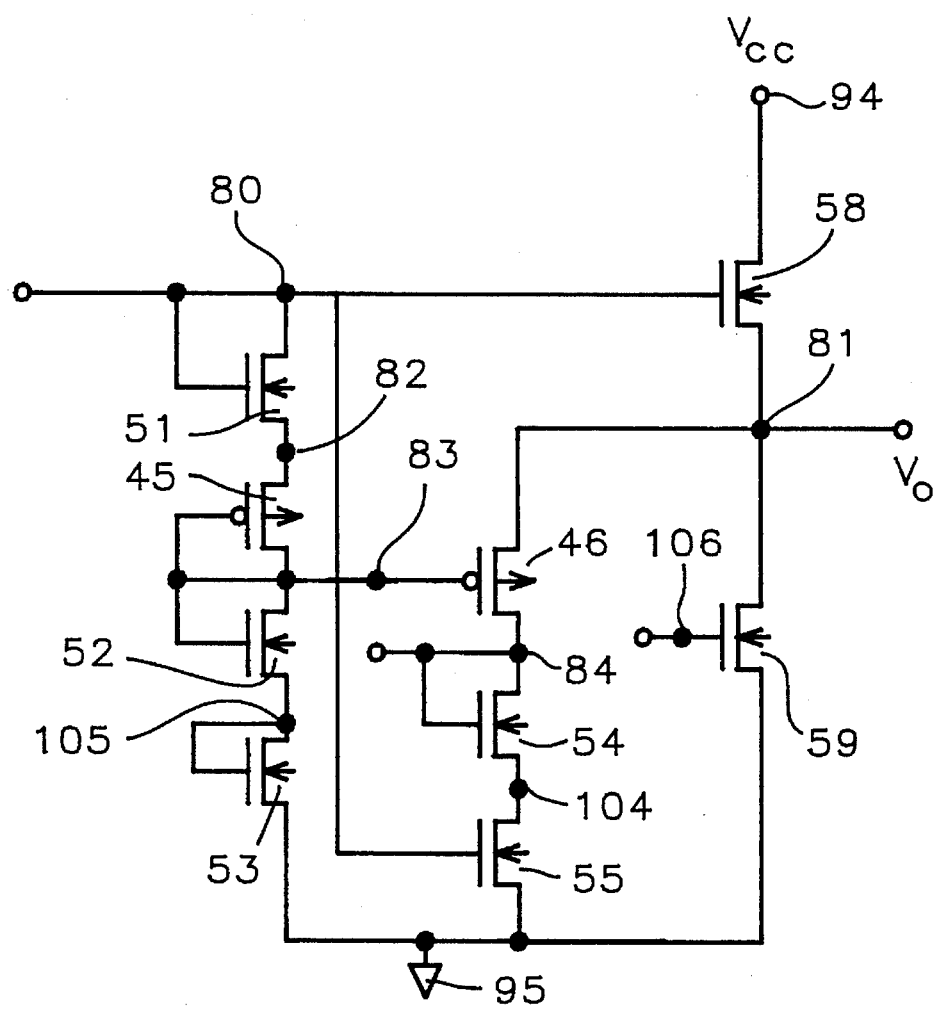
FIG. 3 is a schematic diagram of the output voltage clamping circuit.

Refer now to FIG. 3, there is shown an embodiment of the output voltage clamping circuit for the voltage appearing at the output voltage node 81. FIG. 3 shows a schematic diagram of the internal voltage clamping circuit described in the immediately preceding embodiment and the output voltage clamping circuit, which will clamp the voltage at the output voltage node 81 to about 3.3 volts when the output voltage is at the up level. The output voltage clamping circuit comprises a sixth PMOS-FET 46, a fourth NMOS-FET 54, and a fifth NMOS-FET 55. The drain of the sixth PMOS-FET 46 is connected to the output voltage node 81 and the gate of the sixth PMOS-FET 46 is connected to a third node 83. The third node 83 is also connected to the gate and source of the fifth PMOS-FET 45 and the gate and drain of the second NMOS-FET 52 of the internal voltage clamping circuit. The source of the sixth PMOS-FET 46 is connected to the gate and drain of the fourth NMOS-FET 54. The source of the fourth NMOS-FET 54 is connected to the drain of the fifth NMOS-FET 55. The source of the fifth NMOS-FET 55 is connected to ground. The gate of the fifth NMOS-FET 55 is connected to the first node 80 and to the gate of the first output NMOS-FET 58. The source of the first output NMOS-FET 58 is connected to the output node 81 and to the drain of the second output NMOS-FET 59. The source of the second output NMOS-FET 59 is connected to ground. The second output NMOS-FET 59 does not affect the voltage at the output voltage node 81 and the gate connection of the second output NMOS-FET 59 is not shown.

The source of the first NMOS-FET 51 of the internal voltage clamping circuit and the drain of the fifth PMOS-FET 45 of the internal voltage clamping circuit are connected together at a second node 82. The voltage at the second node 82 is equal to the threshold voltage of the first NMOS-FET 51 subtracted from the voltage at the first node 80 and is also equal to the voltage at the third node 83 added to the threshold voltage of the first PMOS-FET 45. The voltage at the output voltage node 81 is equal to the threshold voltage of the first output NMOS-FET 58 subtracted from the voltage at the first node 80 and is also equal to the voltage at the third node 83 added to the threshold voltage of the sixth PMOS-FET 46. Since the threshold voltages of the NMOS-FETs are nearly equal and the threshold voltages of the PMOS-FETs are nearly equal the voltage at the second node 82 and the voltage at the output voltage node 81 are equal.

The voltage at the first node 80 is clamped to about 4.3 volts by the internal voltage clamping circuit as described in the preceding embodiment. Since the first NMOS-FET 51 is connected in diode mode and the NMOS-FET threshold voltage is about 1.0 volt s so the voltage at the second node 82 and the output voltage node 81 is about 3.3 volts, or the voltage at the first node 80 minus about 1.0 volts. If the voltage at the output voltage node 81 tends to increase above 3.3 volts the sixth PMOS-FET 46 turns on and the voltage at the output voltage node 81 is pulled back to 3.3 volts. If the voltage at the output voltage node 81 tends to decrease below 3.3 volts the first output NMOS-FET 58 turns on and the voltage at the output voltage node 81 is pulled back to 3.3 volts. In this manner the voltage at the output voltage node 81 is clamped to 3.3 volts.

Figure 4:
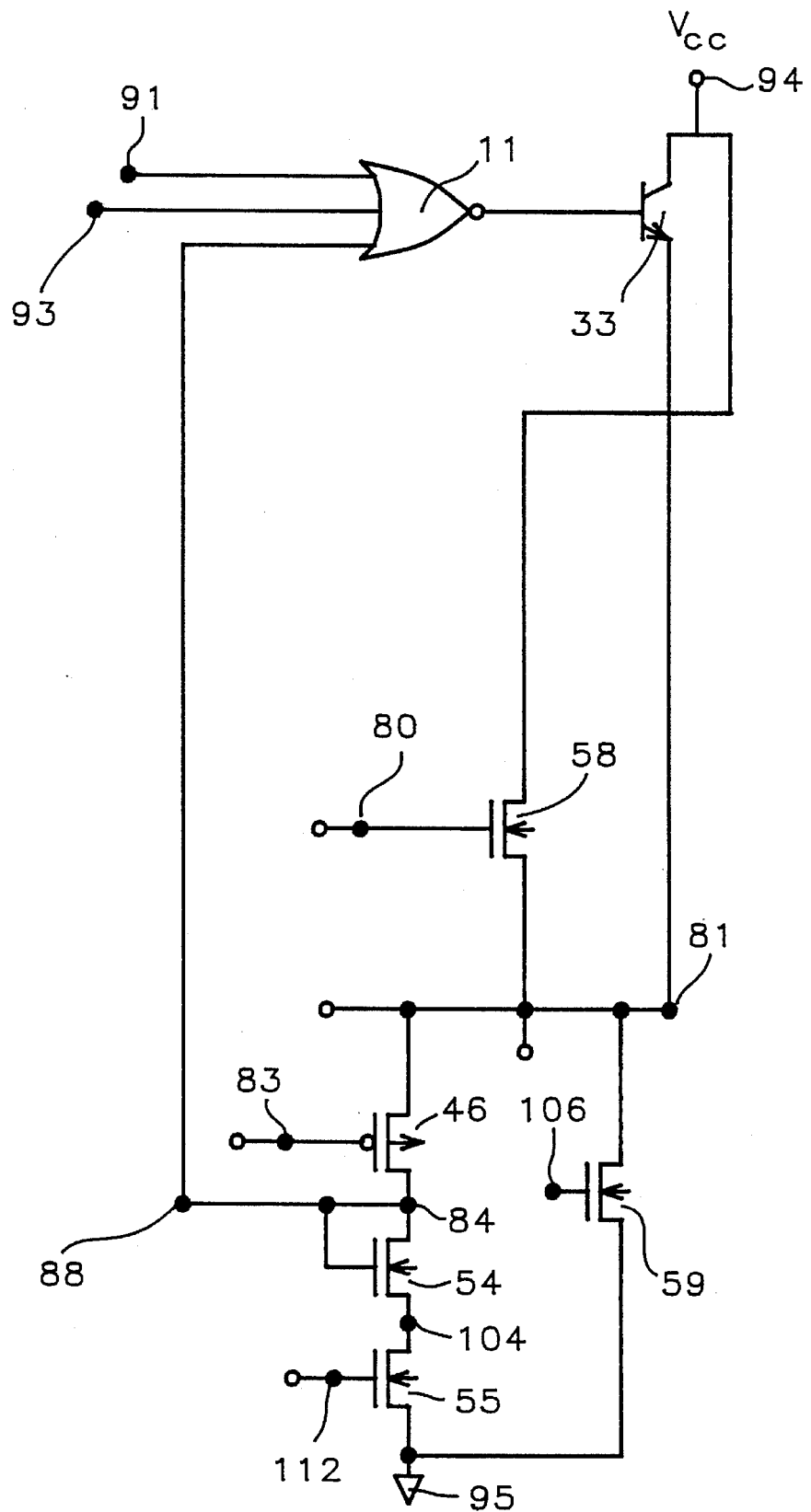
FIG. 4 is a schematic diagram of the load detection and feedback circuit.

Refer now to FIG. 4, there is shown an embodiment of the load detection and feedback circuit. The embodiment comprises a NOR circuit 11, an NPN bipolar transistor 33, the output voltage clamping circuit described in the immediately preceding embodiment, a first output NMOS-FET 58, and a second output NMOS-FET 59. The NPN bipolar transistor is a parasitic transistor in an integrated circuit element having NMOS-FETs and PMOS-FETs. The NOR circuit 11 is part of the modified NOR gate shown in FIG. 2 and described earlier. The rest of the modified NOR gate does not affect the operation of the load detection and feedback circuit and is not shown here. The output of the NOR circuit 11 is connected to the base of the NPN bipolar transistor 33. The collector of the NPN bipolar transistor 33 is connected to the $V_{cc}$ voltage supply which is between about 4.0 volts and 6.0 volts. The emitter of the NPN bipolar transistor 33 is connected to the output voltage node 81. The source of the sixth PMOS-FET 46 of the output voltage clamping circuit, the drain of the fourth NMOS-FET 54 of the output voltage clamping circuit, and the gate of the fourth NMOS-FET 54 of the output voltage clamping circuit are all connected to a fourth node 84. The fourth node 84 is then connected to one of the inputs of the NOR circuit 11 thereby providing feedback.

The voltage at the output voltage node 81 is clamped at 3.3 volts by the output voltage clamping circuit. If there is a transistor transistor logic load, or any heavy load, at the output voltage node 81 the load will tend to pull the voltage at the output voltage node 81 below 3.3 volts. If the voltage at the output voltage node 81 tends to fall below 3.3 volts the current in the fourth NMOS-FET 54 of the output voltage clamping circuit becomes near zero and the voltage at the fourth node 84 becomes low. When the voltage at the fourth node 84 becomes low the output of the NOR circuit 11 is high thereby turning the NPN bipolar transistor 33 on. When the NPN bipolar transistor 33 turns on the voltage at the output voltage node 81 rises back toward 3.3 volts.

If the voltage at the output node 81 tends to rise above 3.3 volts the forth NMOS-FET 54 of the output voltage clamping circuit turns on and the voltage at the fourth node 84 becomes high. When the voltage at the fourth node 84 becomes high the output of the NOR circuit 11 is low thereby turning the NPN bipolar transistor 33 off. When the NPN bipolar transistor 33 turns off the voltage at the output voltage node 81 is pulled back down toward 3.3 volts. In this manner the voltage at the output voltage node 81 is kept at 3.3 volts over a wide range of loading conditions.

Figure 5:
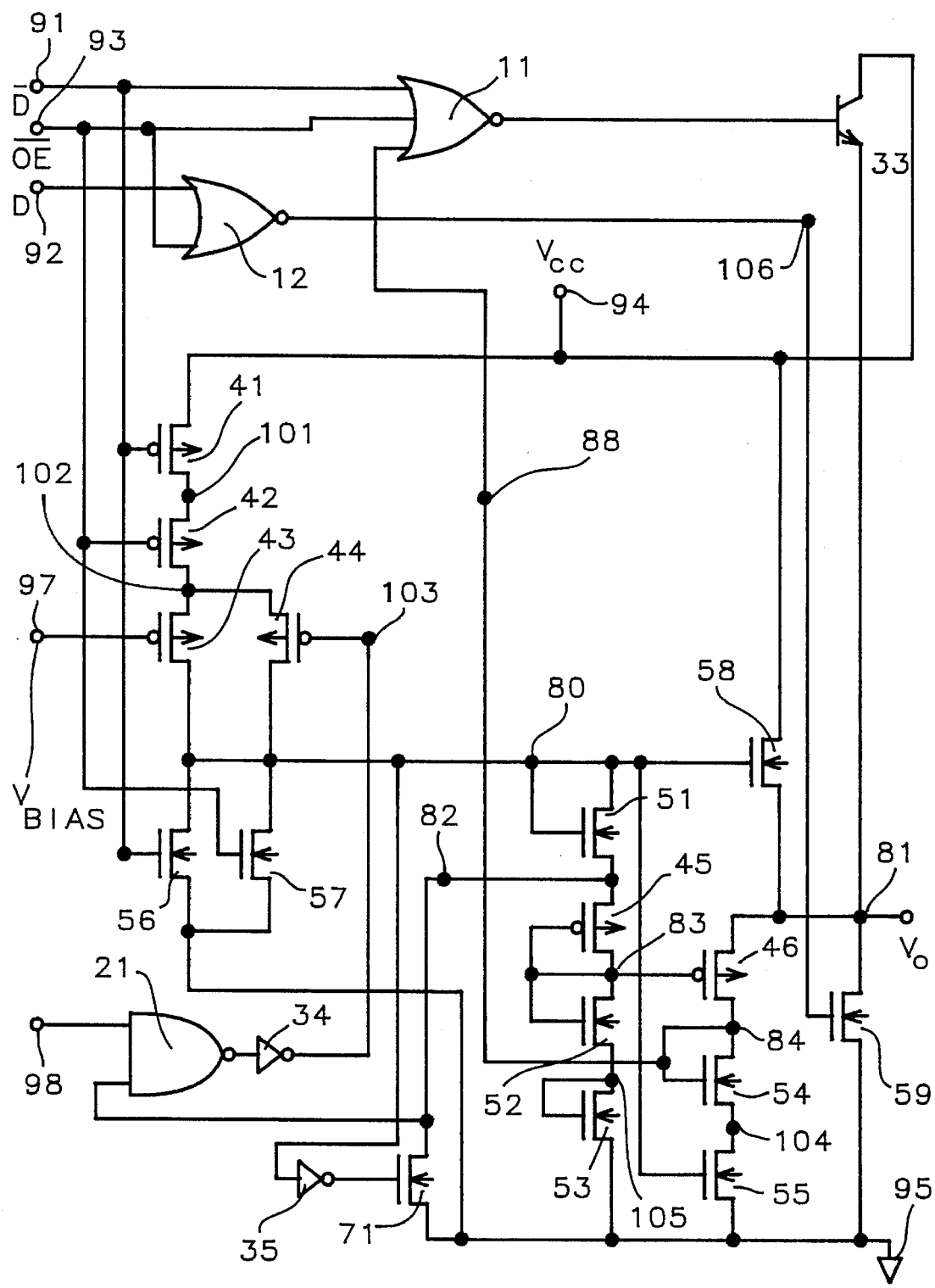
FIG. 5 is a schematic diagram of the output buffer circuit.

Refer now to FIG. 5, there is shown the preferred embodiment of the output buffer circuit for CMOS integrated circuits. The output buffer circuit comprises the modified NOR gate, the internal voltage clamping circuit, the output voltage clamping circuit, and the load detection and feedback circuit of the previous embodiments.

As shown in FIG. 5, the first NOR circuit 11 is connected to the first PMOS-FET 41, the second PMOS-FET 42, the third PMOS-FET 43, the fourth PMOS-FET 44, the sixth NMOS-FET 56, and the seventh NMOS-FET 57 to form the modified NOR gate described earlier. The inverse data input of the first NOR circuit 11 is connected to the gate of the first PMOS-FET 41 and the gate of the sixth NMOS-FET 56. The inverse clock input of the first NOR circuit 11 is connected to the gate of the second PMOS-FET 42 and the gate of the seventh NMOS-FET 57.

The internal voltage clamping circuit, described earlier, comprises the first NMOS-FET 51, the fifth PMOS-FET 45, the second NMOS-FET 52, and the third NMOS-FET 53 and is connected between the first node 80 and the ground node 95. The output voltage clamping circuit, described earlier, comprises the sixth PMOS-FET 46, the fourth NMOS-FET 54, and the fifth NMOS-FET 55, and is connected between the output voltage node 81 and the ground node 95. The gate of the fifth NMOS-FET 55 of the output voltage clamping circuit is connected to the first node. The gate of the fourth NMOS-FET 54 of the output voltage clamping circuit, the drain of the fourth NMOS-FET 54 of the output voltage clamping circuit, and the source of the sixth PMOS-FET 46 of the output voltage clamping circuit are all connected to an input of the first NOR circuit 11. The gate of the sixth PMOS-FET 46 of the output voltage clamping circuit, the gate and source of the fifth PMOS-FET 45 of the internal voltage clamping circuit, and the gate and drain of the second NMOS-FET 52 of the internal voltage clamping circuit are all connected together at a third node 83.

The output of the first NOR circuit 11 is connected to the base of the NPN transistor 33 of the output load detection and feedback circuit. The collector of the NPN transistor 33 is connected to the $V_{cc}$ supply voltage of between about 4.0 and 6.0 volts. The emitter of the NPN transistor 33 is connected to the output voltage node 81. The drain of the first output NMOS-FET 58 is connected to the $V_{cc}$ supply voltage, the gate of the first output NMOS-FET 58 is connected to the first node 80, and the source of the first output NMOS-FET 58 is connected to the output voltage node 81. The drain of the second output NMOS-FET 59 is connected to the output voltage node 81, the gate of the second output NMOS-FET 59 is connected to the output of the second NOR circuit 12, and the source of the second output NMOS-FET 59 is connected to the ground node 95.

The output of a NAND circuit 21, having two inputs and an output, is connected to the input of a first inverter 34 and the output of the first inverter 34 is connected to the gate of the fourth PMOS-FET 44 of the modified NOR gate. The first input of the NAND circuit 21 is connected to the high Vcc detection node 98. The first node 80 is connected to the input of a second inverter 35. The output of the second inverter 35 is connected to the gate of a tenth NMOS-FET 71. The drain of the tenth NMOS-FET 71 is connected to source of the first NMOS-FET 51 of the internal voltage clamping circuit and to the second input of the NAND circuit 21 to provide circuit timing. The source of the tenth NMOS-FET 71 is connected to the ground node 95.

The circuit operation is as described in the previous embodiments. The internal voltage clamping circuit provides a voltage at the first node 80 of about 4.3 volts, when the voltage at the output voltage node 81 is at the up level, over a wide range of $V_{cc}$ supply voltage. The output voltage clamping circuit provides a voltage at the output node 81 of about 3.3 volts, when the voltage at the output voltage node 81 is at the up level. The load detection and feedback circuit maintains a voltage at the output voltage node 81 of about 3.3 volts, when the voltage at the output voltage node 81 is at the up level, over a wide range of loading conditions. The output buffer circuit of this invention provides a stable output voltage over a wide range of loading and voltage supply conditions.

While the invention has been particularly shown and described with reference to the preferred embodiments thereof, it will be understood by those skilled in the art that various changes in form and details may be made without departing from the spirit and scope of the invention.

What is claimed is:

1. An output voltage buffer circuit, comprising:

an internal voltage node;

an output voltage node;

a $V_{cc}$ voltage supply node;

a ground node;

a modified OR-INVERT gate having inputs and an output wherein said output of said modified OR-INVERT gate is connected to said internal voltage node;

a second OR-INVERT gate having inputs and an output;

an internal voltage clamping circuit connected to said internal voltage node;

an output voltage clamping circuit connected to said internal voltage node and said output voltage node;

a load detection and feedback circuit connected to said output voltage clamping circuit and said output voltage node;

a first output metal oxide semiconductor field effect transistor having a gate, a source, and a drain wherein said gate of said first output metal oxide field effect transistor is connected to said internal voltage node, said source of said first output metal oxide field effect transistor is connected to said output voltage node, and said drain of said first output metal oxide semiconductor field effect transistor is connected to said $V_{cc}$ voltage supply node; and a second output metal oxide semiconductor field effect transistor having a gate, a source, and a drain wherein said drain of said second output metal oxide field effect transistor is connected to said output voltage node, said gate of said metal oxide field effect transistor is connected to said output of said second OR-INVERT gate, and said source of said second output metal oxide semiconductor field effect transistor is connected to said ground node.

2. The output voltage buffer circuit of claim 1 wherein said internal voltage clamping circuit holds the voltage at said internal voltage node at about 4.3 volts when the voltage at said output voltage node is at the up level.

3. The output voltage buffer circuit of claim 1 wherein said output voltage clamping circuit holds the voltage at said output voltage node at about 3.3 volts when the voltage at said output voltage node is at the up level.

4. The output buffer circuit of claim 1 wherein said load detector and feedback circuit holds the voltage at said output voltage node at about 3.3 volts when the voltage at said output voltage node is at the up level.

5. The output buffer circuit of claim 1 wherein said the voltage at said $V_{cc}$ voltage supply node is between about 4.0 volts and 6.0 volts.

6. The output buffer circuit of claim 1 wherein said internal voltage clamping circuit further comprises:

a first node;

a second node;

a third node;

a first N channel metal oxide semiconductor field effect transistor having a drain, a gate, and a source wherein said drain of said first N channel metal oxide semiconductor field effect transistor is connected to said internal voltage node, said gate of said first N channel metal oxide semiconductor field effect transistor is connected to said internal voltage node, and said source of said first N channel metal oxide semiconductor field effect transistor is connected to said first node;

a first P channel metal oxide semiconductor field effect transistor having a drain, a gate, and a source wherein said drain of said first P channel metal oxide semiconductor field effect transistor is connected to said first node, said gate of said first P channel metal oxide semiconductor field effect transistor is connected to said second node, and said source of said first P channel metal oxide semiconductor field effect transistor is connected to said second node;

a second N channel metal oxide semiconductor field effect transistor having a drain, a gate, and a source wherein said drain of said second N channel metal oxide semiconductor field effect transistor is connected to said second node, said gate of said second N channel metal oxide semiconductor field effect transistor is connected to said second node, and said source of said second N channel metal oxide semiconductor field effect transistor is connected to said third node; and a third N channel metal oxide semiconductor field effect transistor having a drain, a gate, and a source wherein said drain of said third N channel metal oxide semiconductor field effect transistor is connected to said third node, said gate of said third N channel metal oxide semiconductor field effect transistor is connected to said third node, and said source of said third N channel metal oxide semiconductor field effect transistor is connected to said ground node.

7. The output buffer circuit of claim 1 wherein said output voltage clamping circuit further comprises:

a fourth node;

a fifth node;

a second P channel metal oxide semiconductor field effect transistor having a drain, a gate, and a source wherein said drain of said second P channel metal oxide semiconductor field effect transistor is connected to said output voltage node, said gate of said second P channel metal oxide semiconductor field effect transistor is connected to said internal voltage clamping circuit, and said source of said second P channel metal oxide semiconductor field effect transistor is connected to said fourth node;

a fourth N channel metal oxide semiconductor field effect transistor having a drain, a gate, and a source wherein said drain of said fourth N channel metal oxide semiconductor field effect transistor is connected to said fourth node, said gate of said fourth N channel metal oxide semiconductor field effect transistor is connected to said fourth node, and said source of said fourth N channel metal oxide semiconductor field effect transistor is connected to said fifth node; and a fifth N channel metal oxide semiconductor field effect transistor having a drain, a gate, and a source wherein said drain of said fifth N channel metal oxide semiconductor field effect transistor is connected to said fifth node, said gate of said fifth N channel metal oxide semiconductor field effect transistor is connected to said internal voltage node, and said source of said fifth N channel metal oxide semiconductor field effect transistor is connected to said ground node.

8. The output buffer circuit of claim 1 wherein said load detection and feedback circuit further comprises:

an NPN bipolar transistor having a collector, a base, and an emitter wherein said collector of said NPN bipolar transistor is connected to said $V_{cc}$ voltage supply node, said emitter of said NPN bipolar transistor is connected to said output voltage node, and said base of said NPN bipolar transistor is connected to said output of said modified OR-INVERT gate; and a connection between one of said inputs of said modified OR-INVERT gate and said output voltage clamping circuit.

9. The output buffer circuit of claim 8 wherein said NPN bipolar transistor is a parasitic transistor in an integrated circuit element containing metal oxide semiconductor field effect transistors.

10. The output buffer circuit of claim 1 wherein said internal voltage clamping circuit, said output voltage clamping circuit, and said load detection and feedback circuit are contained in a single integrated circuit element.

* * * * *